United States Patent
Doi et al.

(10) Patent No.: US 9,513,340 B2
(45) Date of Patent: Dec. 6, 2016

(54) POWER INFORMATION DISPLAY DEVICE, POWER INFORMATION DISPLAY SYSTEM AND POWER INFORMATION DISPLAY METHOD

(71) Applicant: Sharp Kabushiki Kaisha, Osaka-shi, Osaka (JP)

(72) Inventors: Misuzu Doi, Osaka (JP); Yumiko Kawazoe, Osaka (JP); Hirosuke Miki, Osaka (JP); Norihiro Ochi, Osaka (JP); Morihiro Katsurada, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 53 days.

(21) Appl. No.: 14/419,674

(22) PCT Filed: Aug. 7, 2013

(86) PCT No.: PCT/JP2013/071332
§ 371 (c)(1),
(2) Date: Feb. 5, 2015

(87) PCT Pub. No.: WO2014/024910
PCT Pub. Date: Feb. 13, 2014

(65) Prior Publication Data
US 2015/0185292 A1    Jul. 2, 2015

(30) Foreign Application Priority Data
Aug. 7, 2012 (JP) ................. 2012-175080

(51) Int. Cl.
G08B 23/00 (2006.01)
G01R 31/36 (2006.01)
H01M 10/48 (2006.01)
H02J 7/00 (2006.01)

(52) U.S. Cl.
CPC ....... *G01R 31/3689* (2013.01); *G01R 31/3606* (2013.01); *G01R 31/3624* (2013.01); *H01M 10/488* (2013.01); *G01R 31/3651* (2013.01); *H01M 2220/10* (2013.01); *H02J 7/0047* (2013.01)

(58) Field of Classification Search
CPC ................ G01R 19/16542; G01R 31/3682; H02J 2007/005; H02J 7/0047
See application file for complete search history.

(56) References Cited

U.S. PATENT DOCUMENTS

| | | | |
|---|---|---|---|
| 6,396,407 B1 * | 5/2002 | Kobayashi | G01R 31/3655 320/132 |
| 2002/0113575 A1 * | 8/2002 | Lee | H02J 7/0047 320/132 |
| 2009/0094473 A1 * | 4/2009 | Mizutani | G06F 1/3203 713/340 |
| 2013/0049468 A1 | 2/2013 | Iwasaki et al. | |

FOREIGN PATENT DOCUMENTS

| | | |
|---|---|---|
| JP | 2002-062955 A | 2/2002 |
| JP | 2009-044895 A | 2/2009 |
| WO | 2011/142330 A1 | 11/2011 |

OTHER PUBLICATIONS

Official Communication issued in International Patent Application No. PCT/JP2013/071332, mailed on Sep. 10, 2013.

* cited by examiner

Primary Examiner — Kerri McNally
Assistant Examiner — Renee Dorsey
(74) Attorney, Agent, or Firm — Keating & Bennett, LLP

(57) ABSTRACT

A power information display device includes: a power information acquisition unit which acquires information relating to a remaining capacity of a storage battery, and information relating to power consumption of devices that use power of the storage battery; and a display unit which displays usable time of the storage battery when a plurality of devices are operating, and usable time when at least one of the plurality of devices has stopped.

8 Claims, 11 Drawing Sheets

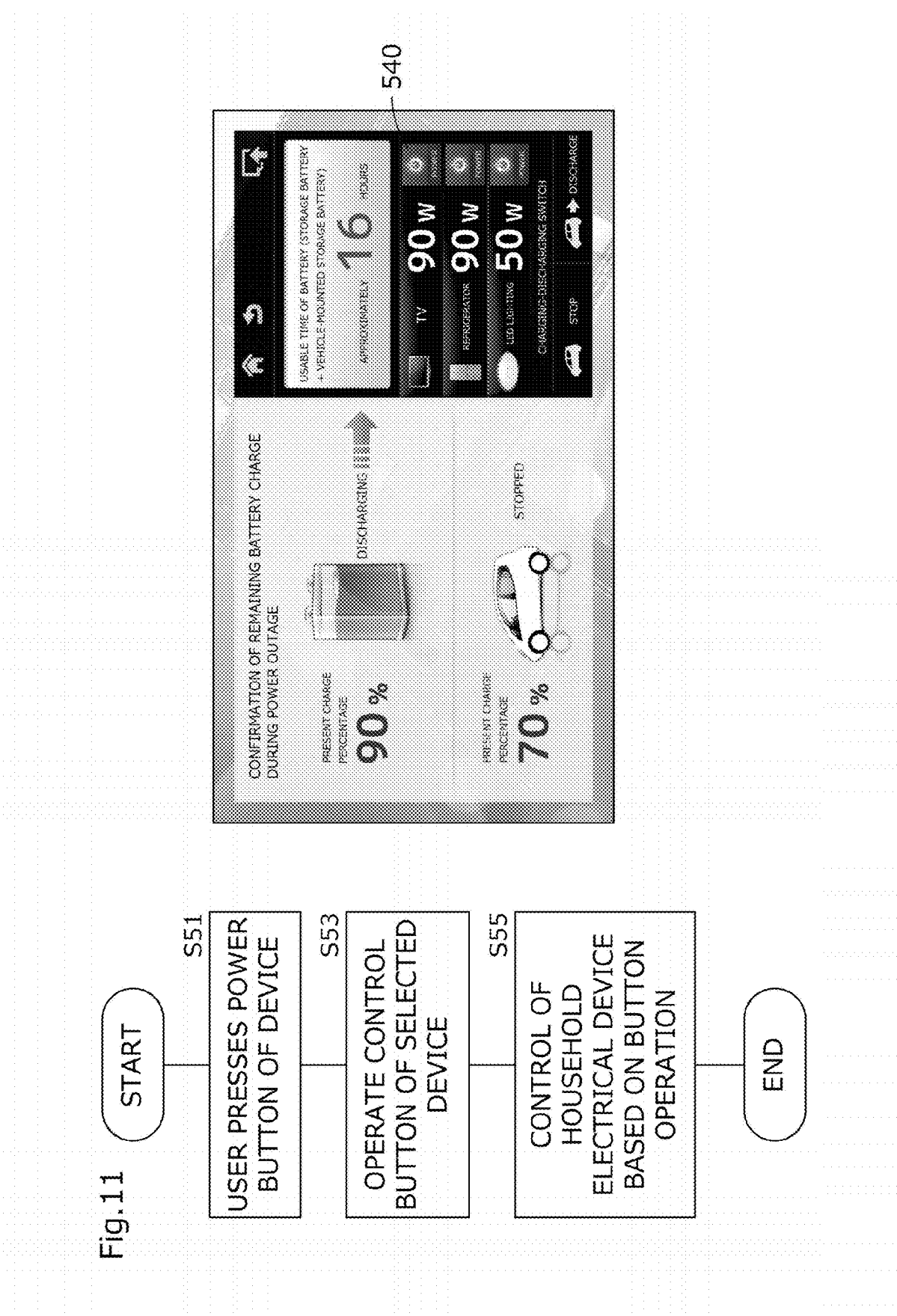

ically as operation time and is not reset upon occurrence of an electrical fault. For example, when a battery pack is used in a device with a high power consumption (a washing machine, a vacuum cleaner, etc.), a detection circuit is implemented that compares a signal voltage corresponding to a sampling current with a certain reference value and, if the voltage is lower (indicating high consumption), the reset time is set longer.

Various proposals have been made with respect to the function of providing a notification of an approximate operating time of an electrical device using a battery. In addition, a proposal is made to monitor the amount of electric power used in a household, wherein the display device displays past electric power consumption on a daily basis and also predicts future electric power consumption. In this proposal, the daily electric power consumption is stored in a storage, and a predicted value of electric power consumption for each day of the week is calculated from the average value of the power consumption on the same day of the week in the past. The predicted power consumption is displayed, allowing a user to examine his/her electrical energy usage, which may lead to energy savings in the household as a whole.

POWER INFORMATION DISPLAY DEVICE, POWER INFORMATION DISPLAY SYSTEM AND POWER INFORMATION DISPLAY METHOD

TECHNICAL FIELD

The present invention relates to a power management device which is applied to an indoor power management system which includes a storage battery and a plurality of power meters, in which the storage battery is capable of supplying power to a plurality of electrical devices, and the plurality of power meters measure a power consumed by each of the electrical devices.

BACKGROUND ART

In general, a battery-driven electrical device has a function of notifying a user of an approximate operation period that the electrical device can operate for using the battery mounted therein.

Various propositions have been made in relation to the function. For example, a battery pack described below is known. The object of the battery pack is to allow a user of a device to more correctly recognize the display of the remaining capacity of a rechargeable battery. When it is detected that an order electric current has dropped to a predetermined value during charging, a cumulative value of the current indicating the battery capacity is reset to a reference cumulative value. Furthermore, the reference cumulative value and a threshold value corresponding to the remaining capacity of the battery of zero are corrected according to a degradation level based on the number of times the battery is charged and the like.

In recent years, there is increased awareness of environmental problems and energy saving. In light of this increased awareness, there is a focus on buildings such as housing and offices that are designed to fully exploit natural energy, referred to as so-called renewable energy, such as solar light, solar heat, and wind power, instead of limited fossil fuels. Such buildings attempt to reduce the environmental burden of indoor life as much as possible. Of the types of renewable energy, especially solar photo-voltaic generation is becoming commonplace in familiar settings. Furthermore, housing designed to comprehensively promote a reduction in the environmental burden for the entire building (eco-housing) is proposed.

When performing power generation using natural energy, starting with photo-voltaic generation, the amount of power generation fluctuates greatly depending on natural conditions such as the season, the time of day, and the region. Tendencies of the fluctuation in the amount of power generation do not match those of the fluctuation in the amount of power consumption. A power management system provided with a storage battery in which surplus energy is stored is proposed from the perspective of effectively using the electrical energy that is generated. The power management system stores the surplus electrical energy that is generated using photo-voltaic generation during the daytime in the storage battery, for example. After sunset, savings are made in the power consumed from the power system by performing independent operation in which the energy that is stored in the storage battery is supplied to the electrical devices without receiving a supply of power from the power system. When there is a power outage in the power system, it is possible to drive the electrical devices using the energy stored in the storage battery.

CITATION LIST

Patent Literature

PTL 1: Japanese Unexamined Patent Application Publication No. 2009-44895

SUMMARY OF INVENTION

Technical Problem

In the indoor power management system described above, the storage battery enables saving of energy of the power system through independent operation, and when there is a power outage, the storage battery can function as an uninterruptible power supply device. However, the capacity of the storage battery is limited. Therefore, it is anticipated that a user wishes to know the usable time of the storage battery during independent operation. Particularly, during a power outage, since the electrical devices will stop when the energy stored in the storage battery runs out, it is important to notify the user of the usable time in particular.

However, while in the case of a storage battery that is mounted in a device as in PTL 1, the usable time may be estimated with only the device as the load to which the storage battery is mounted, in the case of a storage battery that supplies power to a plurality of electrical devices, the load fluctuates according to the operational states of the various electrical devices in the building. If the estimation of the usable time is not performed taking the operational states of the electrical devices into consideration, the estimation of the usable time will greatly deviate from reality.

The invention takes the issues described above into consideration, and provides a power information display device capable of estimating the usable time of the storage battery according to the operational states of the electrical devices in the building when performing independent operation without receiving a supply of power from the power system.

Solution to Problem

The invention provides a power information display device that includes: a power information acquisition unit which acquires information relating to a remaining capacity of a storage battery, and information relating to power consumption of devices that use power of the storage battery; and a display unit which displays usable time of the storage battery when a plurality of devices are operating, and usable time when at least one of the plurality of devices has stopped.

Further, the invention provides a power information display method that includes acquiring information relating to a remaining capacity of a storage battery, and information relating to power consumption of devices that use power of the storage battery; calculating usable time of the storage battery when a plurality of devices are operating, and usable time when at least one of the plurality of devices has stopped; and displaying the calculated usable times on a display unit.

Advantageous Effects of Invention

According to the invention, it is possible to provide a power information display device capable of estimating the usable time of the storage battery according to the operational states of the electrical devices in the building when performing independent operation without receiving a supply of power from the power system.

BRIEF DESCRIPTION OF DRAWINGS

FIG. 11 is a flowchart illustrating a process in relation to an operation of a device power button illustrated in FIG. 8.

DESCRIPTION OF EMBODIMENTS

Figure 1:
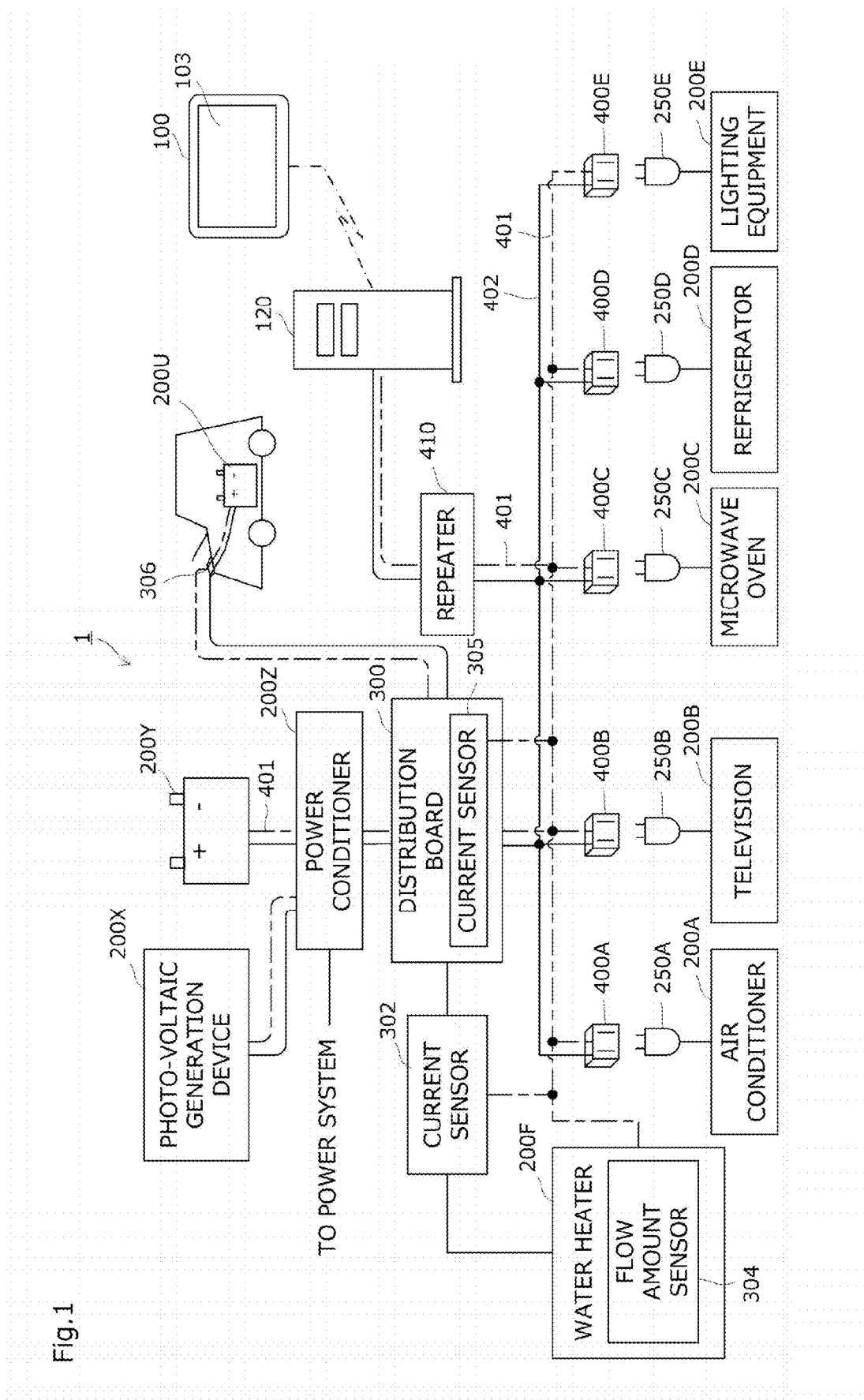
FIG. 1 is an explanatory diagram illustrating the configuration of a power management system according to an embodiment of the present invention.

Hereinafter, description will be given of preferable examples of the invention.

The first preferable example provides a power information display device that includes: a power information acquisition unit which acquires information relating to a remaining capacity of a storage battery, and information relating to power consumption of devices that use power of the storage battery; and a display unit which displays usable time of the storage battery when a plurality of devices are operating, and usable time when at least one of the plurality of devices has stopped.

The display unit can display the usable time according to the power of the storage battery when the devices are operating, and the usable time when at least one of the devices has stopped on a same screen.

Furthermore, the display unit can display the usable time of the storage battery when the devices are operating, and the usable time when at least one of the devices has stopped according to states of the devices.

Alternatively, the display unit is capable of selectively displaying an operating state and a stopped state of each of the devices, and can display the operating state or stopped state of the devices on the same screen as the usable time.

Further, the invention provides a power information display device that includes: a power information acquisition unit which acquires information relating to a remaining capacity of a storage battery, and information relating to power consumption of devices that use power of the storage battery; and a display unit which displays usable time of the storage battery when a plurality of devices are operating which is calculated using the information relating to the remaining capacity of the storage battery and the information relating to the power consumption of the devices, and usable time when at least one of the plurality of devices has stopped which is calculated using the information relating to the remaining capacity of the storage battery and the information relating to the power consumption of the devices.

Furthermore, the display unit is capable of selectively displaying a display indicating a hypothetical operating state and a display indicating a hypothetical stopped state for each of the devices, and can display the hypothetical operating state or hypothetical stopped state on the same screen as the usable time.

Alternatively, the invention provides a power information display device that includes: a power information acquisition unit which acquires information relating to a remaining capacity of a storage battery, and information relating to power consumption of devices that use power of the storage battery; and a display unit which displays usable time of the storage battery in a first state in which a plurality of devices are operating, and usable time in a second state in which at least one of the plurality of devices has stopped from the first state.

Furthermore, the invention provides a power information display system that includes: a storage battery; a power meter which measures information relating to power consumption of devices that use power of the storage battery; and the power information display device described above.

A second preferable example provides a power information display method that includes: acquiring information relating to a remaining capacity of a storage battery, and information relating to power consumption of devices that use power of the storage battery; calculating usable time of the storage battery when a plurality of devices are operating, and usable time when at least one of the plurality of devices has stopped; and displaying the calculated usable times on a display unit.

A third preferable example provides a power management device for an indoor power management system which is applied to an indoor power management system which includes a storage battery and a plurality of power meters, in which the storage battery is capable of supplying power to a plurality of electrical devices, and the plurality of power meters measure a power consumed by each of the electrical devices. The power management device is provided with a power information acquisition unit, an operation acquisition unit, a processing unit, and an information provision unit. The power information acquisition unit sequentially acquires a remaining capacity of the storage battery and the power consumption of each of the electrical devices as power information from the storage battery and each of the power meters. The operation acquisition unit receives a selection performed by a user of some or all of the plurality of electrical devices. In response to the selection, the processing unit sequentially calculates a usable time for which the storage battery can supply power to the selected electrical devices based on the power information relating to the selected electrical devices and the remaining capacity of the storage battery. The information provision unit notifies the user of the usable time.

The processing unit may calculate the usable time of the storage battery during the independent operation in which power is supplied to the electrical devices from the storage battery without receiving a supply of power from the power system, and cause the information provision unit to provide the usable time. If this configuration is adopted, it is possible to calculate the usable time according to the operational states of the electrical devices when the independent operation is actually being performed, and to notify the user of the calculated usable time.

Here, the term "independent operation" refers to a state in which power is supplied to the electrical devices from the storage battery when a supply of power cannot be received from the power system, or when a supply of power is not received from the power system. For example, in the case of the indoor power management system provided with a photo-voltaic generation device, a state in which not only the power from the storage battery, but also the power generated by the photo-voltaic generation device is supplied to the electrical devices is included in the term "independent operation".

The operation acquisition unit acquires an operation of selecting or deselecting each of the electrical devices, and when the selection of a certain electrical device is removed, the processing unit may calculate the usable time of a case in which the electrical device has stopped and cause the information provision unit to provide the calculated usable time. If this configuration is adopted, it is possible to calculate the usable time according to the operations of selection and deselection without actually operating or stopping each of the electrical devices.

Furthermore, when the selection of a certain electrical device is in a removed state but the electrical device is operating, the processing unit may control the information provision unit to notify the user that, in regard to the electrical device, the anticipated state in the calculation of the usable time differs from the present operation. If this configuration is adopted, it is possible to notify the user that the actual states of the electrical devices differ from the states of the electrical devices used as the conditions of the calculation of the usable time, and to urge the user to handle the issue.

Alternatively, a control unit which communicates with the electrical devices and controls the operation and stopping of the electrical devices may be further provided, and the control unit may perform control such that, when an operation of selecting or deselecting a certain electrical device is performed, the electrical device may be operated or stopped according to the operation. If this configuration is adopted, it is possible to operate and stop the electrical devices according to the operation of selecting or deselecting the electrical device, and to cause the actual states of the electrical devices to match the states of the electrical devices used as the conditions of the calculation of the usable time.

A vehicle-mounted storage battery connecting portion which connects the storage battery in parallel with a vehicle-mounted storage battery of an electric automobile in order to use the vehicle-mounted storage battery as a power source of the electrical devices may be further provided. When the vehicle-mounted storage battery is connected to the vehicle-mounted storage battery connecting portion, the operation acquisition unit may receive operations that enable and disable the supply of power from the vehicle-mounted storage battery to each of the electrical devices. When the supply of power from the vehicle-mounted storage battery is enabled, the processing unit may sequentially calculate the usable time for which the storage battery and the vehicle-mounted storage battery can supply power to the selected electrical devices. If this configuration is adopted, it is possible to supply power to the electrical devices from the vehicle-mounted storage battery in the same manner as the storage battery, to calculate the usable time according thereto, and to notify the user of the calculated usable time.

Preferable examples of the invention include an example in which some of the plurality of examples indicated herein are combined.

In the third preferable example, according to the power management device of the indoor power management system which includes a storage battery capable of supplying power to a plurality of electrical devices and a plurality of power meters that measure the power consumed by each of the electrical devices, since the processing unit sequentially calculates the usable time for which the storage battery can supply power to the selected electrical devices based on the power information in regard to the selected electrical devices and the remaining capacity of the storage battery, when independent operation is performed without receiving a supply of power from the power system, it is possible to estimate the usable time of the storage battery according to the operational states of the electrical devices in the building.

The storage battery is a storage battery that supplies power, not to an individual electrical device, but to a plurality of electrical devices used in buildings such as housing and offices. A specific example of the storage battery is a lithium ion battery which is installed in order to store electrical energy generated by a photo-voltaic generation device, for example. In the embodiment described later, the home storage battery corresponds to the storage battery.

Each of the power meters is associated with one of the electrical devices, measures the information relating to the power consumption of the associated electrical device, and transmits the information to the indoor power management server. A specific example of the power meter is a power consumption measurement device which measures the power consumption of the individual electrical devices.

The usable time is the time that the home storage battery can continuously supply power to the electrical devices.

Hereinafter, the embodiment will be described in greater detail using the drawings. Note that, the following description is exemplary in all regards, and should not be interpreted as limiting the embodiment.

<Configuration of Power Management System>

An indoor power management system according to the present embodiment includes a power management device, and the power management device manages power information relating to the power consumption in at least one electrical device. Note that, a photo-voltaic generation device, a fuel cell, or the like may also be the management target, and in this case, the power management system according to the present embodiment may manage power information relating to power generation in addition to or instead of power information relating to power consumption.

In the present specification, the power information is a concept that includes various information relating to the power consumption/the power generation in supported electrical devices (electrical equipment).

Hereinafter, a power management system including one or a plurality of electrical devices used in a building is described as an example; however, the embodiment of the present invention is not only to be applied to such a power management system. In other words, the embodiment of the present invention can be applied to any configuration, as long as information relating to power consumption is measured using a meter or the like.

In the present specification, the electrical device is a concept that includes both a device which operates using power supplied from various portions, and a device which generates power by some form of energy. A building includes a house, an office, and the like.

FIG. 1 is a schematic diagram illustrating the overall configuration of a power management system 1 according to the present embodiment.

As illustrated in FIG. 1, the power management system 1 according to the present embodiment is installed in a building such as a house or an office. More specifically, the power management system 1 includes a plurality of household electrical devices as the electrical devices which consume power.

While not limited hereto, FIG. 1 depicts an air conditioner (an air conditioning device) 200A, a television 200B, a microwave oven 200C, a refrigerator 200D, lighting equipment 200E, and a water heater 200F as household electrical devices which are installed in a building (these are referred to collectively as "household electrical devices 200"). The power management system 1 includes a photo-voltaic generation device 200X as an electrical device that generates power, and a storage battery 200Y which performs storage/discharge of the power. The storage battery 200Y is for building use and is to be installed in housing or the like. Furthermore, the power management system 1 includes a vehicle-mounted storage battery 200U which is connected via a vehicle-mounted storage battery connecting portion 306.

The vehicle-mounted storage battery 200U is normally mounted to an electric automobile, is used for driving the electric automobile, and is connected to the power management system 1 according to the embodiment via the vehicle-mounted storage battery connecting portion 306 for charging. In other words, the power management system 1 charges the vehicle-mounted storage battery 200U that is connected via the vehicle-mounted storage battery connecting portion 306.

However, when an operation of an instruction from a user is present during a power outage, for example, the vehicle-mounted storage battery 200U discharges the power stored therein in the same manner as the storage battery 200Y for housing. It is possible to supply the power to the household electrical devices 200.

The power management system 1 includes a power conditioner 200Z which is connected to the photo-voltaic generation device 200X, the storage battery 200Y, the power system (commercial power provided by a power company, for example), and a distribution board 300, and is for controlling the respective powers. The power conditioner 200Z supplies power to the household electrical devices 200 using a power line 402 connected via a distribution board 300 after balancing the generated power from the photo-voltaic generation device 200X, the power charged and discharged between the power conditioner 200Z and the storage battery 200Y, and the power purchased from the power system from a perspective of efficiency. Note that, the distribution board 300 supplies power to the water heater 200F using another path that is branched from the power line 402. A current sensor 302 is provided between the distribution board 300 and the water heater 200F, and it is possible to measure the power supplied to the water heater 200F using the current sensor 302. The water heater 200F is provided with a flow amount sensor 304 for measuring the flow amount of water discharged from the water heater 200F.

It is possible to convert the flow amount of discharged water into power consumption or power consumption amount by using the current sensor 302 and the flow amount sensor 304.

The distribution board 300 is provided with a current sensor 305, and it is possible to obtain the power supplied to the household electrical devices 200 by measuring the current supplied to the household electrical devices 200 by the power line 402.

Furthermore, the power management system 1 includes meters 400A to 400E, the photo-voltaic generation device 200X, the storage battery 200Y, a repeater 410, an indoor power management server 120, and a management terminal 100. The meters 400A to 400E are associated with the household electrical devices 200, the repeater 410 is for monitoring and controlling the water heater 200F, the power conditioner 200Z and the like, the indoor power management server 120 is a power management device, and the management terminal 100 acquires and displays display data from the indoor power management server 120. The indoor power management server 120 is capable of data communication with the meters 400A to 400E associated with the household electrical devices 200, the current sensor 302, the flow amount sensor 304, the photo-voltaic generation device 200X, the storage battery 200Y, the power conditioner 200Z, and the like via a wired or wireless network 401 and the repeater 410.

An arbitrary network can be used as the network 401. If a wired network is used, for example, it is possible to use Ethernet (registered trademark), Power Line Communications (PLC), or the like as the so-called physical-dependent layer (lower layer) exemplified by the physical layer, the data link layer, and the like of the OSI basic reference model. If a wireless network is used, for example, it is possible to use a wireless Local Area Network (LAN) conforming to the IEEE 802.11 standard, ZigBee (registered trademark), Bluetooth (registered trademark), infrared communication methods, or the like. Furthermore, a plurality of communication methods may be combined.

Furthermore, it is possible to use, for example, ZigBee (registered trademark), ECHONET Lite, KNX, Z-wave, or the like as the upper layers of the OSI basic reference model.

Each of the meters (power meters) 400 is associated with one of the household electrical devices 200, measures information relating to the power consumption in the associated household electrical device 200, and transmits the measured information to the repeater 410. Typically, power consumption measuring devices disposed between the power line 402 and the plugs of the household electrical devices 200 which measure the states of the power consumption are used as the meters 400. As a different example, the meters 400 may be configured integrally with the household electrical devices 200, embedded therein. As another different example, the meters 400 may be configured integrally with the power sockets provided on the building side.

Note that, while the water heater 200F is not associated with a meter 400, as described above, the measurement results of the current sensor 302 and the flow amount sensor 304 are transmitted to the repeater 410. The measurement results are transmitted from the repeater 410 to the indoor power management server (the power management device) 120, and are accumulated on a hard disk 109 provided in the indoor power management server 120. The indoor power management server 120 is capable of acquiring information relating to the power consumption by performing conversion into power consumption or power consumption amount based on the measurement results of the sensors. The management terminal (the power information display device) 100 displays the information provided by the indoor power management server 120 on a display (a display unit) 103.

In the example illustrated in FIG. 1, the five meters 400A to 400E are electrically connected to the power line 402. A plug 250A of the air conditioner 200A is connected to the meter 400A, a plug 250B of the television 200B is connected to the meter 400B, a plug 250C of the microwave oven 200C is connected to the meter 400C, a plug 250D of the refrigerator 200D is connected to the meter 400D, and a plug 250E of the lighting equipment 200E is connected to the meter 400E. Therefore, the meters 400A to 400E measure information relating to power consumption in the air conditioner 200A, the television 200B, the microwave oven 200C, the refrigerator 200D, and the lighting equipment 200E, respectively.

Note that, in regard to the water heater 200F, the information relating to the power consumption is measured using a sensor.

The indoor power management server 120 stores the information relating to the power consumption transmitted thereto from each of the meters 400 and the like associated with each of the household electrical devices 200 on the hard disk 129.

The management terminal 100 communicates with the indoor power management server 120, and provides a user interface which presents the state and information of the power management system 1 to the user and receives instructions relating to the power management in the power management system 1 from the user.

The management terminal 100 can display a graph or the like relating to the power consumption based on the data provided from the indoor power management server 120. For example, the indoor power management server 120 may provide a website, and the management terminal 100 may be provided with a browser function to view the website. The management terminal 100 may be portable, or may be detachable in relation to a base disposed on a table, or may be fixed to a wall of a room.

In the present example, the repeater 410 and the indoor power management server 120 which collect data (not shown) are provided, and the repeater 410 performs data communication with the meters 400A to 400E. The data of the power information relating to the household electrical devices connected to the meters is collected. The indoor power management server 120 acquires and accumulates the power information from each of the meters 400A to 400E from the repeater 410. Furthermore, the indoor power management server 120 performs a computation of the usable time of the storage battery 200Y. The management terminal 100 acquires and displays the usable time computed by the indoor power management server 120 and the display data provided by the indoor power management server 120. A configuration of an embodiment in which the management terminal 100 also functions as the indoor power management server 120 and acquires the data through data communication with each of the meters can be used as a modification example of the configuration described above.

In the power management system 1 illustrated in FIG. 1, while the indoor power management server 120 acquires the power information from the meters 400, no transaction is performed with the household electrical devices associated with the meters 400. As another configuration of the embodiment, one may be adopted in which the indoor power management server 120 acquires the power information from the meters 400 and performs transactions with the household electrical devices associated with the meters 400.

When this configuration is adopted, some or, preferably, all of the air conditioner 200A, the television 200B, the microwave oven 200C, the refrigerator 200D, and the lighting equipment 200E are further connected to the network 401 illustrated in FIG. 1. Furthermore, the water heater 200F may be connected. The household electrical devices connected to the network 401 support the communication protocols used by the power management system 1 and can communicate with the indoor power management server 120 in the same manner as the meters 400.

The communication protocols are ZigBee (registered trademark), ECHONET Lite, KNX, Z-wave, or the like. The indoor power management server 120 can control the operations such as the startup and the stopping of the household electrical devices by the communication, and can acquire the states of the household electrical devices.

Next, description will be given of the hardware configuration of the indoor power management server 120, which is the main power management device in configuring the power management system 1 illustrated in FIG. 1.

<Indoor Power Management Server 120 and Management Terminal 100>

Figure 2:
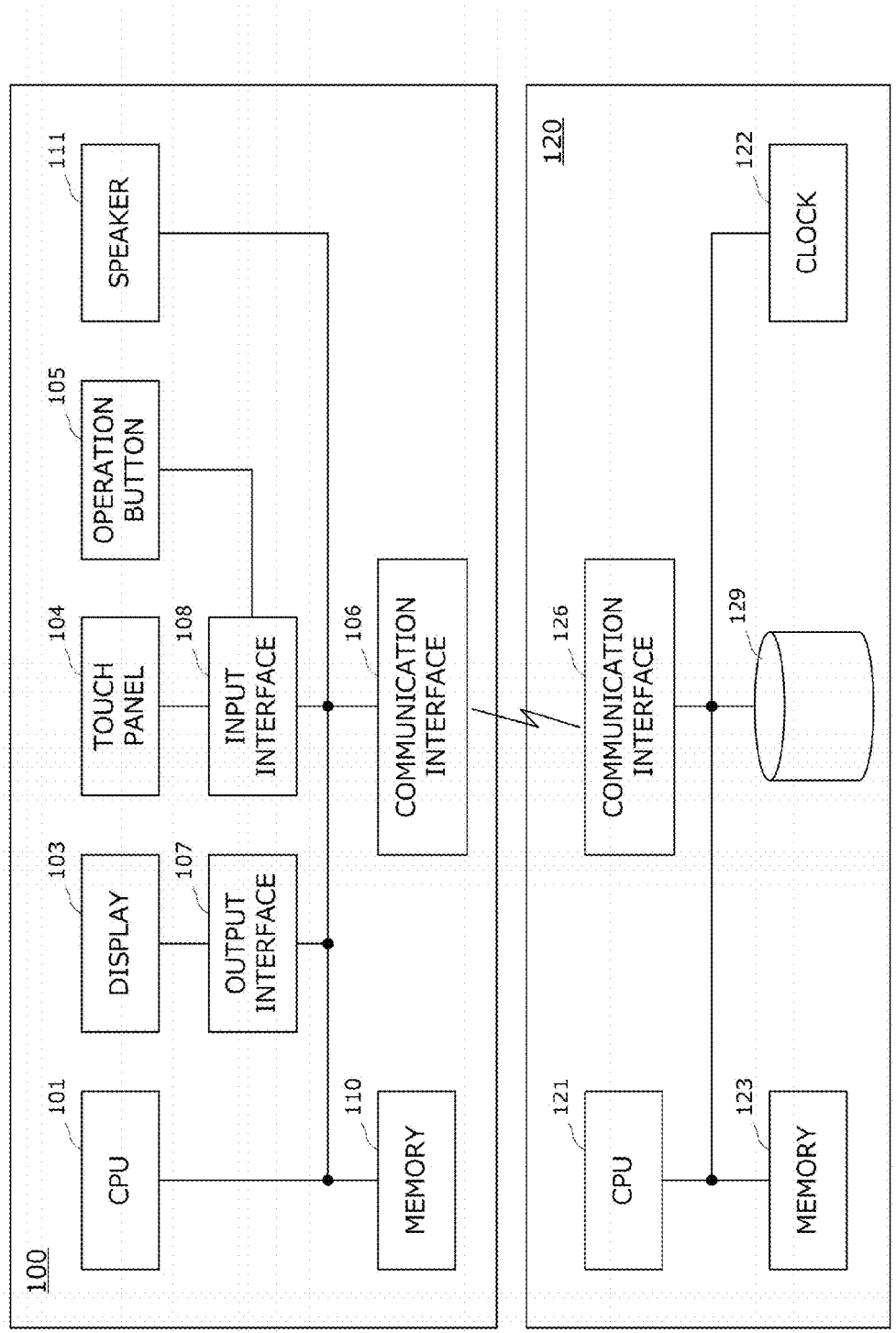
FIG. 2 is a block diagram illustrating the hardware configurations of an indoor power management server and a management terminal according to the embodiment of the present invention.

FIG. 2 is a block diagram illustrating the hardware configurations of the indoor power management server 120 and the management terminal 100 according to the present embodiment.

As illustrated in FIG. 2, the management terminal 100 includes a Central Processing Unit (CPU) 101 which is a processor, the display 103 and a touch panel 104, an operation button 105, a communication interface 106, an output interface 107, an input interface 108, memory 110, and a speaker 111. The indoor power management server 120 includes a CPU 121 which is a processor, a clock 122, memory 123, the communication interface 106, and the hard disk 129. The management terminal 100 and the indoor power management server 120 can perform transactions of data via the respective communication interfaces 106 and 126.

The CPU (the processing unit) 101 of the management terminal 100 is the processing agent which manages the overall process in the management terminal 100, and provides the various functions described later by executing programs stored in advance in the memory 110 and the like. The CPU 101 receives the user operation input by the touch panel 104 or the operation button 105, and the operation is transmitted to the indoor power management server 120 via the communication interface 106.

The display 103 and the touch panel 104 are devices that provide user interfaces. The display 103 presents the display data received from the indoor power management server 120 to the user according to commands from the CPU 101. The touch panel 104 receives the operation performed by the user. The CPU 101 performs control such that the operation received by the touch panel 104 is transmitted to the indoor power management server 120.

More specifically, the display 103, for example, is formed of a Liquid Crystal Display (LCD), an organic Electro Luminescence (EL) display, or the like, and displays an image on the display surface. The touch panel 104 detects a touch operation by a finger or the like of the user, and outputs coordinate values or the like indicating the position at which the touch operation is performed to the CPU 101. In the present embodiment, the touch panel 104 is provided to be associated with the display surface of the display 103. However, the management terminal 100 does not necessarily include a touch panel, and it is sufficient for the management terminal 100 to be capable of presenting various information to the user.

The operation button 105 is an input means for receiving the user operation, and, typically, one or a plurality of the operation buttons 105 is disposed on the surface of the management terminal 100. Typically, the operation button 105 includes a plurality of buttons or keys such as a select button, a back button, directional buttons, and a numeric keypad. When the operation button 105 receives the user operation, the information indicating the user operation is output to the CPU 101.

The communication interface 106 (the power information acquisition unit) performs data communication with the indoor power management server 120 according to the commands from the CPU 101. More specifically, as described above, Ethernet (registered trademark), Power Line Communications (PLC), a wireless Local Area Network (LAN) conforming to the IEEE 802.11 standard, ZigBee (registered trademark), Bluetooth (registered trademark), infrared communication methods, or the like is used for the communication interface 106.

The output interface 107 mediates the transactions of internal commands between the CPU 101 and the display 103. The input interface 108 mediates the transactions of internal commands and/or signals between the touch panel 104 and/or the operation button 105 and the CPU 101.

The memory 110 is realized by Random Access Memory (RAM) which is a volatile memory device, Flash Read-Only Memory (flash ROM) which is a non-volatile memory device, or the like. The memory 110 stores the programs to be executed by the CPU 101 and the work data necessary for the execution of the programs by the CPU 101.

The speaker 111 is an audio device and outputs audio according to commands from the CPU 101.

Meanwhile, the CPU (the processing unit, the information provision unit) 121 is the processing agent which manages the overall process in the indoor power management server 120. The CPU 121 provides the various functions as the management device of the power management system 1 by executing programs stored in advance in the memory 123 or the like. In other words, the CPU 121 executes the processes instructed by the user operation in response to the operation received from the management terminal 100. Examples of the instructions include an instruction relating to the operation/stopping of the household electrical devices 200, an instruction relating to a change in the control mode in relation to the power conditioner 200Z, an instruction to display the present or past power management states, and the like.

The clock 122 is a time measurement means, and, according to a command from the CPU 121, responds to the CPU 121 with the present date and time.

The communication interface 126 (the power information acquisition unit, the operation acquisition unit) performs data communication with the management terminal 100, the meters 400, the photo-voltaic generation device 200X, the storage battery 200Y, the power conditioner 200Z, and the like according to commands from the CPU 121.

The hard disk 129 stores various data necessary for the information processing carried out by the indoor power management server 120. The various data will be described later in detail.

Note that, instead of the hard disk 129, it is possible to use a semiconductor storage medium such as flash memory, mask ROM, Electronically Programmable Read-Only Memory (EPROM), Electronically Erasable Programmable Read-Only Memory (EEPROM), and an Integrated Circuit (IC) card; an optical disc storage medium such as Compact Disc-Read Only Memory (CD-ROM), and Digital Versatile Disk-Read Only Memory (DVD-ROM); a magneto-optical disc storage medium such as a Magnetic Optical Disc (MO), and a Mini Disc (MD); or a magnetic storage medium such as a Flexible Disk (FD), a magnetic tape, and a cassette tape.

The information processing in the indoor power management server 120 is realized by the CPU 121 executing a program in cooperation with the surrounding hardware components. Generally, the program is installed in advance in the memory 123 or the like.

The program can be provided by storing the program on an arbitrary storage medium and distributing the storage medium. Alternatively, the program can be provided by download from a server device (or another device) connected to the Internet or the like. In other words, the stored program is read from the storage medium, or, the program is acquired by download from a server device, and stored temporarily in the memory 123 or the like. The CPU 121 executes a program after expanding the program, which is stored in the memory 123, into an executable format. For the storage medium that stores the program, it is possible to use a semiconductor storage medium such as flash memory, mask ROM, EPROM, EEPROM, and an IC card; an optical disc storage medium such as a CD-ROM, and a DVD-ROM; a magneto-optical disc storage medium such as an MO and an MD; or a magnetic storage medium such as an FD, a magnetic tape, and a cassette tape.

Furthermore, instead of installing the program in advance on the memory 123 or the like, a program stored on another system or device may be read and executed by the CPU 121.

Furthermore, the functions according to the present embodiment may be realized by the program that is read from the storage medium or the like being written to the memory or the like that is mounted to a function expansion board or a function expansion unit installed in a computer, and a computation unit (a CPU or the like) mounted to the function expansion board or the function expansion unit performing some or all of the necessary processes according to the program.

Furthermore, in addition to a configuration in which all of the functions according to the present embodiment are realized by the CPU 121 executing a program, the functions according to the present embodiment may be realized by the Operating System (OS) or the like running on the computer performing some or all of the necessary processes according to the program.

When the functions according to the present embodiment are realized using software such as that described above, the present embodiment is configured by the actual program that is read from the storage medium or the like, or, by the storage medium on which the program is stored.

Note that, in the present specification, the program includes, not only a program that can be directly executed by the CPU 121, but also a program in a source program format, a program subjected to a compression process, and an encrypted program.

<Meter 400>

Figure 3:
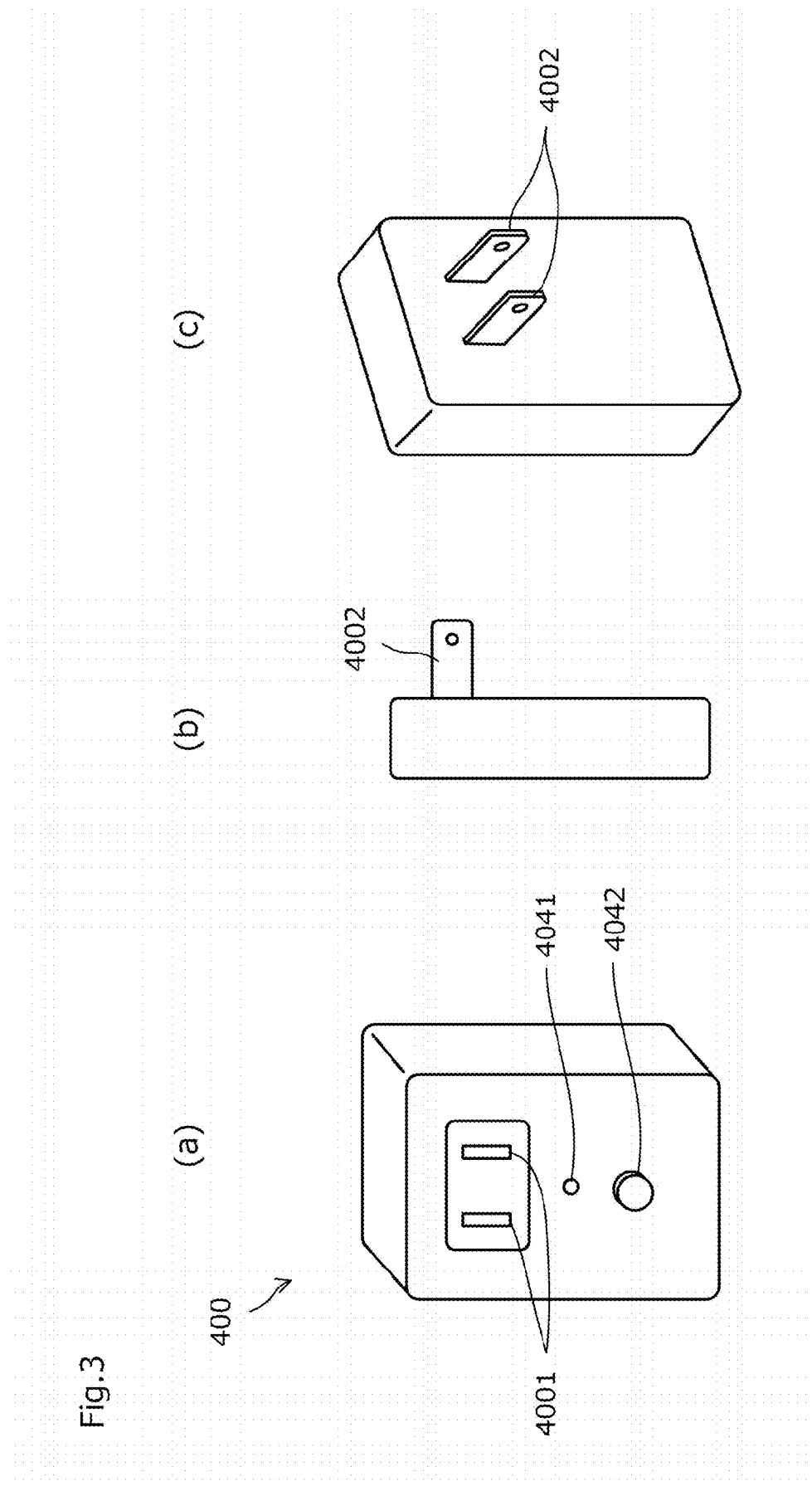
FIG. 3 is a diagram illustrating the external appearance of a meter according to the embodiment of the present invention.

FIG. 3 is a diagram illustrating the external appearance of the meter 400 according to the present embodiment. Here, FIG. 3(a) illustrates a perspective view containing a socket 4001 of the meter 400, FIG. 3(b) illustrates a side view of the meter 400, and FIG. 3(c) illustrates a perspective view containing a plug 4002 of the meter 400.

As illustrated in FIGS. 3(a) to 3(c), the meter 400 is disposed to be interposed between the socket for supplying the power that flows through the power line 402 and the plug of the household electrical device 200. More specifically, as illustrated in FIG. 3(a), the socket 4001 for plug insertion is provided on one surface (the front surface) of the meter 400. Meanwhile, as illustrated in FIGS. 3(b) and 3(c), the plug 4002 is provided on the rear surface, the opposite side to the front surface, of the meter 400. The plug of the household electrical device 200 is plugged into the socket 4001, and the plug 4002 is plugged into the socket (receptacle/outlet) for supplying power via the power line 402 provided inside the building.

Note that, since it is preferable that the meter 400 be as thin as possible, the width of the sides is designed to be as small as possible.

An LED 4041 and a setting button 4042 are further provided on the front surface of the meter 400. The LED 4041 displays the data processing state in the meter 400. More specifically, whether the LED 4041 is lit or not, flashing or not, or the period of the flashing differs depending on the data processing state. Note that, instead of or in addition to changing the display mode of the lighting and the flashing, the color of light emitted may be changed. The setting button 4042 is an input means for receiving a user operation, and when the setting button 4042 is operated by the user, setting initialization or the like starts in the meter 400.

Figure 4:
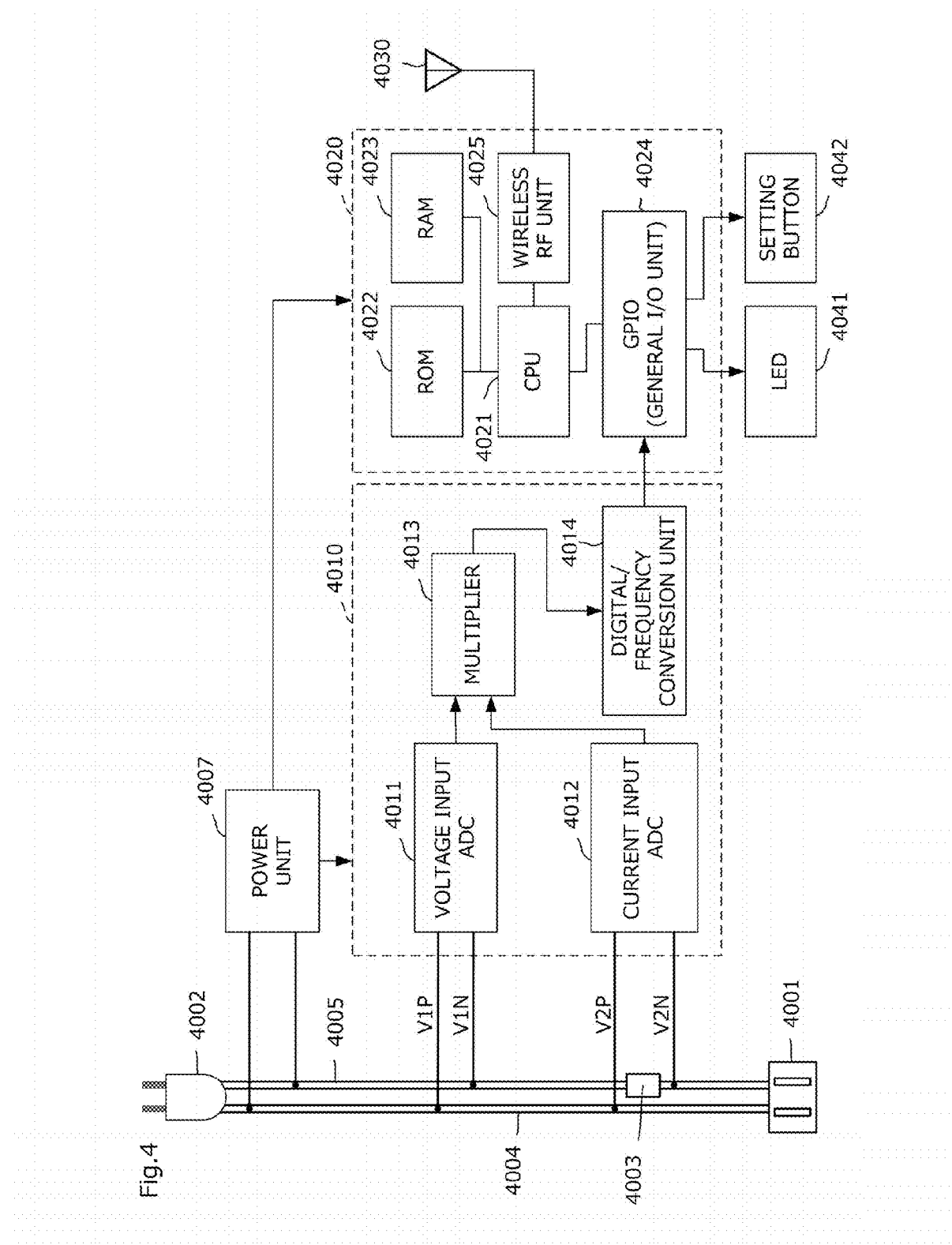
FIG. 4 is a block diagram illustrating the hardware configuration of the meter according to the embodiment of the present invention.

FIG. 4 is a block diagram illustrating the hardware configuration of the meter 400 according to the present embodiment.

As illustrated in FIG. 4, in addition to the socket 4001, the plug 4002, the LED 4041, and the setting button 4042, the meter 400 includes a pair of main wirings 4004 and 4005, a shunt resistor 4003, a power unit 4007, a power detection unit 4010, a communication module 4020, and an antenna 4030. The pair of main wirings 4004 and 4005 electrically connect the socket 4001 to the plug 4002, and the shunt resistor 4003 is inserted in the main wiring 4005.

The power detection unit 4010 detects the power flowing from the plug 4002 to the socket 4001. More specifically, the power detection unit 4010 includes a voltage input Analog to Digital Converter (ADC) 4011, a current input ADC 4012, a multiplier 4013, and a digital/frequency conversion unit 4014.

The voltage input ADC 4011 is connected to both the main wirings 4004 and 4005 via wirings V1P and V1N. The voltage input ADC 4011 outputs a digital signal indicating the voltage (potential difference) arising between the main wirings to the multiplier 4013.

The current input ADC 4012 is electrically connected to both terminals of the shunt resistor 4003 that is inserted into the main wiring 4005 via the wirings V2P and V2N. The shunt resistor 4003 is a minute resistance (hundreds of micro Ω) used for measuring the value of flowing current. The current input ADC 4012 outputs a digital signal indicating the value of the current flowing in the shunt resistor 4003 to the multiplier 4013.

The multiplier 4013 multiplies the digital signal (the voltage value) from the voltage input ADC 4011 with the digital signal (the current value) of the current input ADC 4012, and outputs a digital signal indicating the value obtained as a result (power consumption/unit: W or kW) to the digital/frequency conversion unit 4014.

The digital/frequency conversion unit 4014 converts the digital signal from the multiplier 4013 into a frequency signal, and outputs the frequency signal obtained as a result to the communication module 4020.

The power unit 4007 supplies power to the components of the meter 400. The power unit 4007 is connected to the main wirings 4004 and 4005, and uses a portion of the power flowing from the plug 4002 to the socket 4001 as power for the operations of the meter 400. After converting the alternating current power to direct current power, the power unit 4007 supplies the direct current power to the power detection unit 4010 and the communication module 4020.

The communication module 4020 transmits a wireless signal indicating the power consumption in the electrical device connected to the socket 4001 via an antenna 4030, the power consumption being calculated by the power detection unit 4010. More specifically, the communication module 4020 includes a CPU 4021, ROM 4022, RAM 4023, a General Purpose Input/Output (GPIO) 4024, and a wireless Radio Frequency (RF) unit 4025.

The GPIO 4024 receives the frequency signal input from the digital/frequency conversion unit 4014, and outputs information of the frequency signal to the CPU 4021.

The CPU 4021 subjects the information of the frequency signal from the GPIO 4024 to data conversion according to predetermined logic, and outputs the result to the wireless RF unit 4025. The wireless RF unit 4025 generates a wireless signal by modulating a carrier wave based on the results of the data conversion from the CPU 4021. The wireless signal generated by the wireless RF unit 4025 is transmitted to the repeater 410 via the antenna 4030.

The CPU 4021 realizes the processes described above by executing a program that is stored in the ROM 4022 in advance. The RAM 4023 stores the work data necessary for the execution of the program by the CPU 4021.

<Measurement Information>

Generally, the meter 400 measures the power consumption (unit: W or kW) consumed by the electrical device connected thereto. The power consumption (unit: Wh or kWh) of the electrical device is calculated by integrating the power consumption over a predetermined time.

The server 120 is capable of causing the display 103 of the management terminal 100 to display both the power consumption and the power consumption amount in regard to each of the electrical devices. Furthermore, the server groups the plurality of electrical devices and causes the power consumption and the power consumption amount to be displayed for entire groups.

Therefore, implementation examples of the measurement information are described below (however, examples are not limited to those described below). The measurement information is transmitted from the meter 400 to the indoor power management server 120 via the repeater 410 and relates to the corresponding household electrical device 200.

(1) The meter 400 measures the power consumption in the household electrical device 200 every predetermined period (for example, every five seconds), and transmits the measured power consumption as measurement information at the same transmission period as the measurement period.

(2) The meter 400 measures the power consumption in the household electrical device 200 every predetermined period (for example, every five seconds), and transmits a plurality of power consumption measurements as measurement information at a longer transmission period than the measurement period, the power consumption measurements being those measured from the previous transmission until the present transmission.

(3) The meter 400 measures the power consumption in the household electrical device 200 every predetermined period (for example, every five seconds), and transmits the average power consumption as measurement information at a longer transmission period than the measurement period, the average power consumption being obtained by averaging a plurality of power consumption measurements measured from the previous transmission until the present transmission.

(4) In (2) or (3), transmission is performed after adding the power consumption amount, which is obtained by integrating a plurality of power consumption measurements measured from the previous transmission until the present transmission, to the measurement information. Furthermore, the average value, the minimum value, the maximum value, and the like of a plurality of power consumption measurements may be added.

Time information that the meter 400 acquires by some means may be added to the measurement information; however, generally, when the indoor power management server 120 receives the measurement information from the meters 400 via the repeater 410, the time of reception is acquired from the clock 122, associated with the received measurement information, and stored on the hard disk 129.

It is possible to adopt an arbitrary protocol for the transaction of the measurement information between the indoor power management server 120 and the meters 400 via the repeater 410. Typically, a configuration is adopted in which a packet containing the measurement result measured by the meter 400 itself is broadcast, the repeater 410 receives the packet, and the repeater 410 notifies the indoor power management server 120 of the packet. However, the repeater 410 may periodically poll each of the meters 400.

<(First) Display Example of Usable Time of Storage Battery>

When the indoor power management server 120 performs independent operation using the present remaining charge of the storage battery, the indoor power management server 120 causes the display 103 of the management terminal 100 to display the usable time as an estimate of approximately how long a period the storage battery 200Y can supply energy. The usable time is computed based on the power information of the household electrical devices presently operating. The user can use the usable time as a reference for determining which devices to turn off and which devices to leave on. Even if the independent operation is not actually performed, it is possible to perform a simulation of independent operation, cause the usable time to be displayed, and use the usable time as reference for energy saving. For example, it is possible to use the usable time for determining which household electrical devices should have the power thereof left on in order to achieve a self-sustaining (no commercial power) state.

Typical independent operation is executed when the supply of power from the power system is cut off due to a power outage. Additionally, it is possible to suppress demand in periods in which there is a strain on the supply and demand of the power system in addition to saving money on the electricity bill by performing control so as to perform independent operation during the daytime when energy prices are high, or at a time of day after sunset. In preparation for independent operation, the storage battery 200Y may be charged using the surplus power generated in large amounts during the daytime when the weather is sunny by the photo-voltaic generation device 200X. Alternatively, the storage battery 200Y may be charged during a late night period in which the energy prices are inexpensive. In general, when selling (power selling) the generated power by sending the surplus power generated in the daytime by the photo-voltaic generation device 200X to the power system grid as a reverse power flow, there is a case in which there are restrictions to the reverse power flow due to the balance of supply and demand. At this time, the storage battery 200Y may be charged with the surplus power. It is possible to effectively use energy by chronologically shifting the peak of demand by charging the storage battery 200Y during a period in which surplus energy is generated and performing the independent operation during a period in which the power demand reaches a peak.

Figure 5:
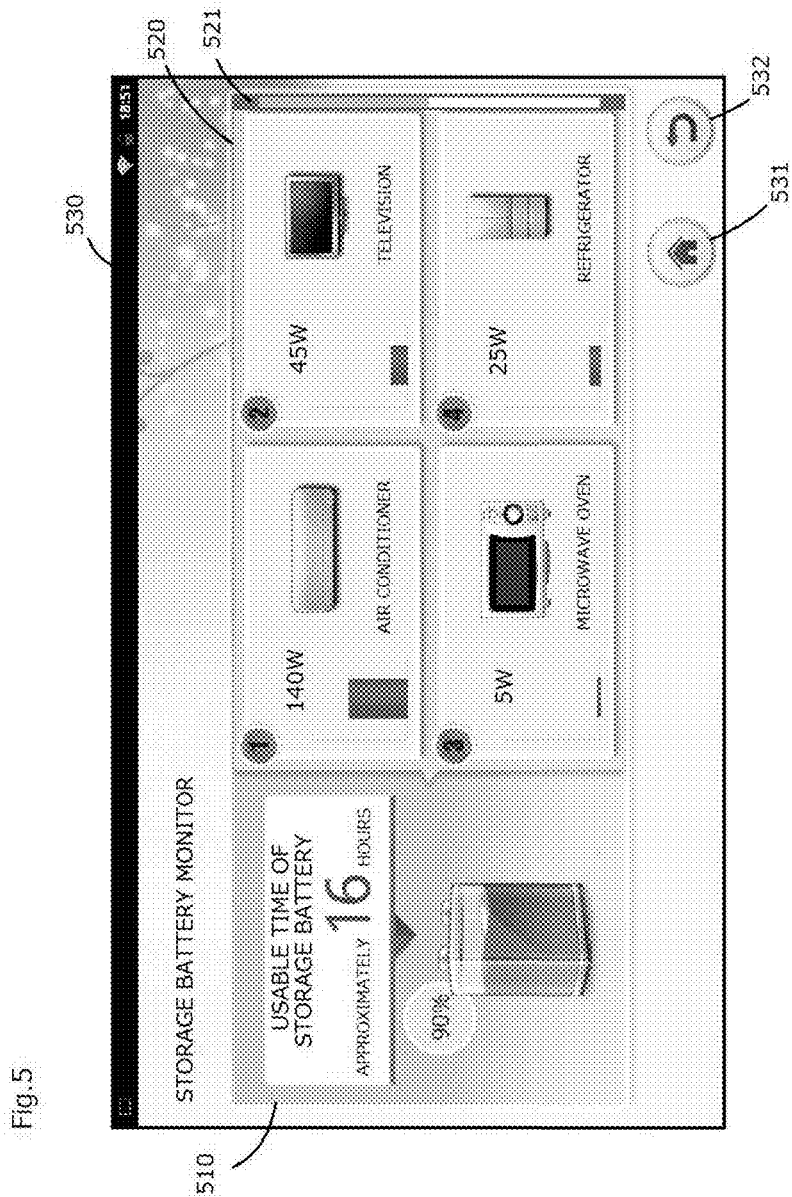
FIG. 5 is an explanatory diagram illustrating an example of a screen that an indoor power management server according to the embodiment of the present invention causes a display of a management terminal to display.

FIG. 5 is an explanatory diagram illustrating an example of a screen that the indoor power management server 120 according to the present embodiment causes the display 103 of the management terminal 100 to display. The screen of FIG. 5 is displayed during independent operation and/or during the simulation of the independent operation. The screen illustrated in FIG. 5 is mainly configured from a storage battery information display section 510 of a left side region, and a device status display section 520 of a right side region. In addition, a status bar 530 indicating the operational state of the management terminal 100 is displayed in a top edge region of the screen, and a "home" button 531 and a "back" button 532 relating to screen changing operations are displayed in a right side region of the bottom of the screen.

In FIG. 5, when the "home" button 531 is touched, the operation is detected by the touch panel 104. The CPU 101 of the management terminal 100 responds to the operation, and performs control so as to inform the indoor power management server 120 of an operation event indicating that the "home" button 531 is touched. The CPU 121 of the indoor power management server 120 generates the display data of the initial screen (not shown) in response to receiving the operation event. The display data is the data of the initial screen (not shown) to be displayed on the display 103 of the management terminal 100. The CPU 121 performs control so as to transmit the generated display data to the management terminal 100.

Meanwhile, when the "back" button 532 is touched, the CPU 121 of the indoor power management server 120 generates the display data of a screen that is one layer higher (not shown) in response to receiving the operation event. The CPU 121 performs control so as to transmit the generated display data to the management terminal 100.

Description will now return to the screen of FIG. 5. Each of the household electrical devices for which the power information is measured by each of the meters 400 is displayed together with the power information thereof as a list in the device status display section 520. In FIG. 5, four devices of an air conditioner, a television, a microwave oven, and a refrigerator are displayed as the household electrical devices. These devices correspond to the air conditioner 200A, the television 200B, the microwave oven 200C, and the refrigerator 200D illustrated in FIG. 1. Note that, while the lighting equipment 200E of FIG. 1 is not depicted in FIG. 5, it is possible to cause the lighting equipment 200E to be displayed using a scroll bar 521 of the right edge. Furthermore, the water heater 200F may be displayed. In a case of a configuration in which a system in which power is supplied from the storage battery 200Y and a system in which the power is not supplied during the independent operation are separated by the distribution board 300, the household electrical devices to which power is not supplied from the storage battery 200Y are not displayed in the device status display section 520. For example, when the power is not supplied to the water heater 200F during the independent operation, the water heater is not displayed. When the power is not supplied to the microwave oven from the storage battery 200Y, the microwave oven is not displayed in the device status display section 520. Note that, in this embodiment, the indoor power management server 120 operated by receiving a supply of power from the storage battery 200Y during the independent operation. Therefore, the indoor power management server 120 may be displayed in the device status display section 520 as one of the household electrical devices.

In the storage battery information display section 510, the present remaining charge of the storage battery 200Y is displayed as a percentage together with an illustration of the storage battery, and further, the usable time of the storage battery 200Y is shown. In the example illustrated in FIG. 5, the remaining charge of the storage battery 200Y is displayed as 90%, and the usable time is displayed as approximately 16 hours. The battery 200Y is connected to the network 401, and the information from the battery 200Y is transmitted to the indoor power management server 120 via the repeater 410. The remaining charge is sequentially updated based on the information from the storage battery 200Y.

The measuring apparatuses 400A to 400E transmits the power information of the corresponding household electrical devices to the indoor power management server 120. The current sensor 302 and the flow amount sensor 304 transmit information to the indoor power management server 120 relating to the water heater 200F. The current sensor 305 transmits information of a total current that flows into the building via the distribution board 300 to the indoor power management server 120. The indoor power management server 120 is provided with a power detection unit (not shown) that detects the power consumed by the indoor power management server 120 itself. The configuration of the power detection unit may be the same as that of the meter 400.

Furthermore, the photo-voltaic generation device 200X transmits information relating to the amount of power generation to the indoor power management server 120. When a vehicle-mounted storage battery 200U of an electric automobile is connected to the vehicle-mounted storage battery connecting portion 306, the vehicle-mounted storage battery 200U transmits information to the indoor power management server 120.

Note that, the information may be transmitted in response to a request from the indoor power management server 120, and may be transmitted automatically by the devices.

The CPU 121 ascertains the state of power supply and demand of the power management system 1 based on the power information acquired from the devices. The usable time of the storage battery 200Y is predicted with the premise that the household electrical devices that are presently operating will continue to be operated.

The present power consumptions of the air conditioner, the television, the microwave oven, and the refrigerator are each displayed in the device information display section 520 of FIG. 5. The air conditioner consumes 140 W of power during operation. The television consumes 45 W of power during operation. The microwave oven consumes 5 W of power in standby. The refrigerator consumes 25 W of power during operation. The CPU 121 calculates the usable time assuming that the present state will continue, including the lighting equipment 200E and the indoor power management server 120 which are not shown in FIG. 5, and causes the usable time to be displayed in the storage battery information display section 510.

Here, when the user touches the icons of each of the household electrical devices displayed in the device display section 520, the CPU 121 of the indoor power management server 120 performs the following processes in response to the reception of the operation event. First, the display of the touched household electrical device is updated to reflect that the touched household electrical device is removed from or selected as one of the targets of the independent operation. Additionally, the usable time of the storage battery 200Y is computed again, and the display of the usable time is updated.

Figure 6:
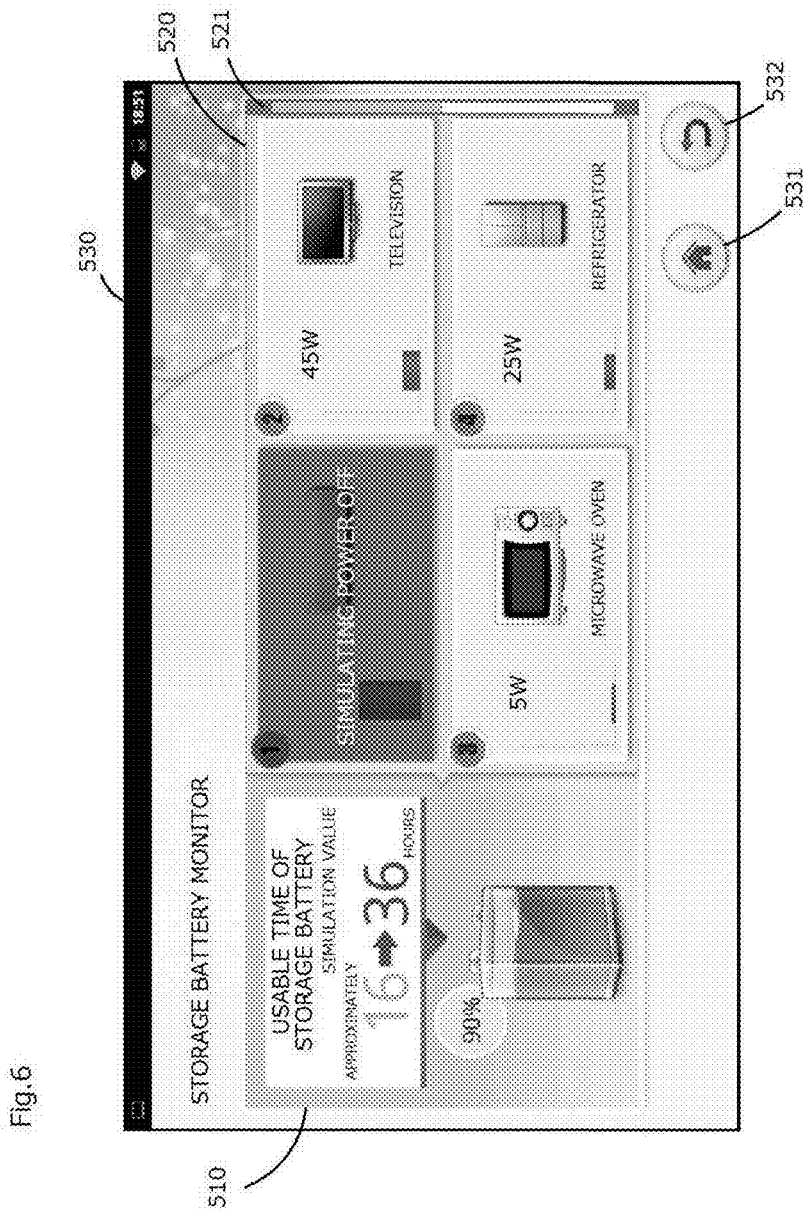
FIG. 6 is an explanatory diagram illustrating an example of a screen, which is illustrated in FIG. 5, that is updated when an icon of an air conditioner is touched.

FIG. 6 illustrates an example of a screen, which is the screen illustrated in FIG. 5, and when an icon of an air conditioner is touched, the screen is updated in response to the operation. As illustrated in FIG. 6, the icon of the air conditioner is grayed out, and the message "simulating power off" is displayed to overlap the icon of the air conditioner. This indicates that the air conditioner itself is operating, but for the purposes of predicting the usable time, the operation of the air conditioner is hypothetically stopped. As a result, "36 hours" is displayed as the usable time in the storage battery information display section 510. However, this is a simulation value of a case in which the operation of the air conditioner has stopped, the usable time of approximately 16 hours for the present state in which the air conditioner is operating is also displayed. When the icon of the air conditioner is touched once more, the simulation of the power OFF of the air conditioner is removed, and the display is updated to the usable time in the present operational state. In other words, the display returns to the screen of FIG. 5.

In this manner, the user can perform a simulation of the usable time by hypothetically causing each of the household electrical devices to operate and stop individually. For example, when the user touches the icon of the microwave oven, the CPU 121 hypothesizes that the microwave oven in standby is operated, updates the usable time, and causes the result to be displayed as a simulation value. Note that, in addition to performing the simulations of operating and stopping according to the icons of the devices being touched, a configuration may be adopted in which the operation mode of each of the devices can be set on the screen.

In FIG. 6, even if the icon of each of the household electrical devices is touched, the actual operation of the household electrical devices does not change, and the touch operation is only reflected in the simulation value of the usable time. This is because, in the power management system 1 of FIG. 1, the household electrical devices are not connected to the network 401, and the indoor power management server 120 cannot control the operation and stopping of the household electrical devices. However, for example, when the user stops the operation of the air conditioner by operating the air conditioner, the updated power information is transmitted to the indoor power management server 120 from the meter 400A, and therefore, the usable time is updated. This is because the CPU 121 sequentially updates the usable time to reflect the present operational states of the household electrical devices.

A case will be considered in which, unlike the configuration of FIG. 1, the household electrical devices are also connected to the network 401 and perform transactions with the indoor power management server 120. In this configuration, the CPU 121 may control the operations of the household electrical devices in response to touch operations of the household electrical devices displayed in the device status display section 520. In this case, the management terminal 100 functions as a remote controller that performs remote operation of the household electrical devices. The usable time is displayed as a usable time based on the states of each of the devices. Alternatively, a configuration may be adopted in which the user can select whether the CPU 121 controls the operation of the household electrical device or simply performs a simulation in response to the touch operation.

When the photo-voltaic generation device 200X is generating electricity, the CPU 121 calculates the usable time with the premise that the present amount of power generation will continue. However, since the amount of power generation by the photo-voltaic generation device 200X fluctuates depending on the amount of sunlight, that is, the weather or time of day, this fluctuation causes a reduction in the prediction precision of the usable time. Therefore, when predicting the usable time, it is preferable to calculate the usable time by averaging or predicting the fluctuations based on the history of the amount of power generation by the photo-voltaic generation device 200X. The fluctuation in the amount of sunlight caused by the flow of clouds on a given day is alleviated by averaging the amount of power generation over several past hours, and it is possible to predict the fluctuation in the amount of sunlight from sunrise to sunset by averaging the amount of power generation by time over several past days.

When performing the simulation of the usable time, the usable time may be calculated by assuming that power is supplied to the household electrical devices only from the storage battery 200Y without including the photo-voltaic generation device 200X. In order to realize this configuration, the icon of the photo-voltaic generation device 200X may be displayed in the device status display section 521. A configuration may be adopted in which whether or not the take the amount of power generation by the photo-voltaic generation device 200X into consideration in the calculation of the usable time is switched according to a touch operation on the icon of the photo-voltaic generation device 200X.

Furthermore, when the charged vehicle-mounted storage battery 200U is connected to the vehicle-mounted storage battery connecting portion 306, power may be supplied from the vehicle-mounted storage battery 200U in addition to the storage battery 200Y to the household electrical devices. The user may switch whether or not to supply power from the vehicle-mounted storage battery 200U to the household electrical devices using the management terminal 100.

<(First) Flowchart>

Figure 7:
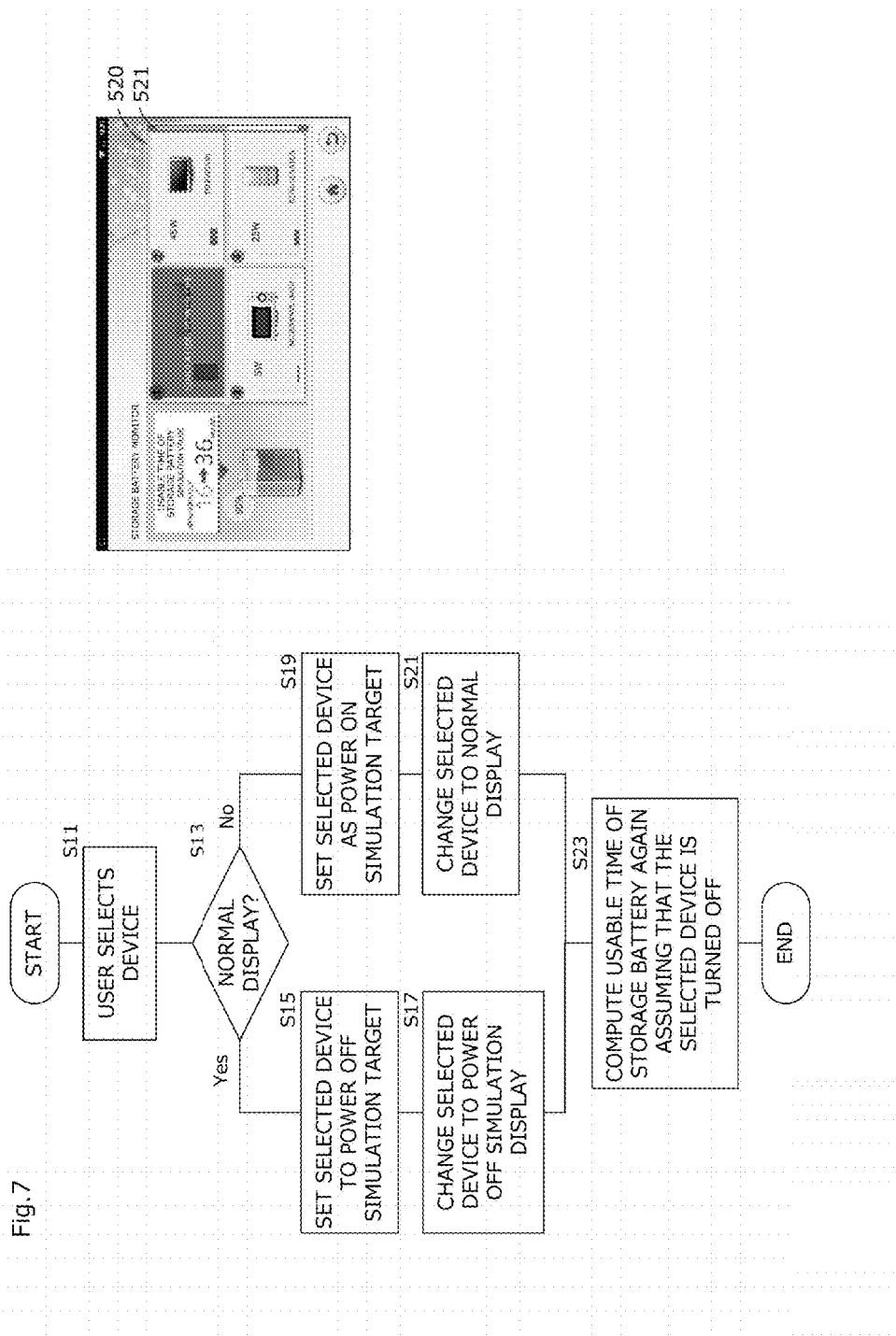
FIG. 7 is a flowchart illustrating a process that causes the screens of FIGS. 5 and 6 to be displayed.

FIG. 7 is a flowchart illustrating a process that executed by the CPU 121 to cause the screens of FIGS. 5 and 6 to be displayed. A scaled down version of the screen of FIG. 6 is shown in the top right of FIG. 7 for reference. Hereinafter, description will be given of the process in accordance with FIG. 7.

When the user touches the icon of a household electrical device in the screen of FIG. 6, the operation event is transmitted to the indoor power management server 120. When the operation event is received, the CPU 121 of the indoor power management server 120 responds to the operation event (step S11), and determines whether the touched icon is the normal display or the power OFF simulation display (step S13). If the touched icon is the normal display (yes in step S13), the selected household electrical device is presently operating, therefore the device is set as the power OFF simulation target (step S15). The CPU 121 sets the icons of the selected devices to grayed out display, and informs the user that the grayed out devices are in the power OFF simulation state (step S17). The selected household electrical devices are assumed to be stopped, the usable time of the storage battery 200Y is computed according to the operational states in the device status display section 520 (step S23), and the display of the usable time is updated based on the computation result.

In the determination of step S13, when the touched icon is the power OFF simulation (no in step S13), the CPU 121 assumes that the selected household electrical device is operating (step S19). The household electrical device is changed to normal display (step S21). Subsequently, the routine proceeds to step S23, the usable time of the storage battery 200Y is computed according to the operational states in the device status display section 520 (step S23), and the display of the usable time is updated based on the computation result.

<(Second) Display Example of Usable Time of Storage Battery>

Figure 8:
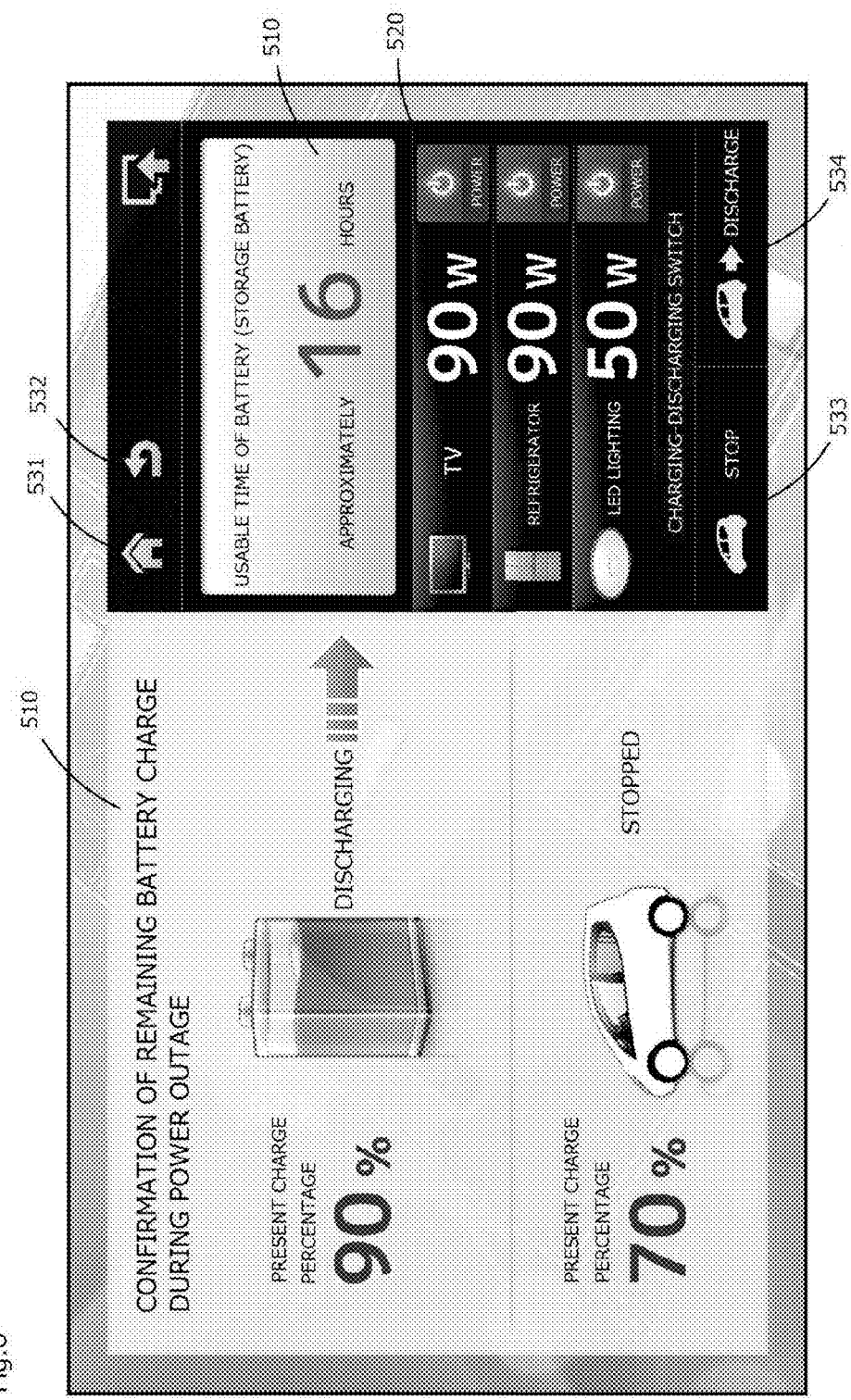
FIG. 8 is an explanatory diagram illustrating an example of a screen that, unlike that of FIG. 5, takes a vehicle-mounted storage battery into consideration.
Figure 9:
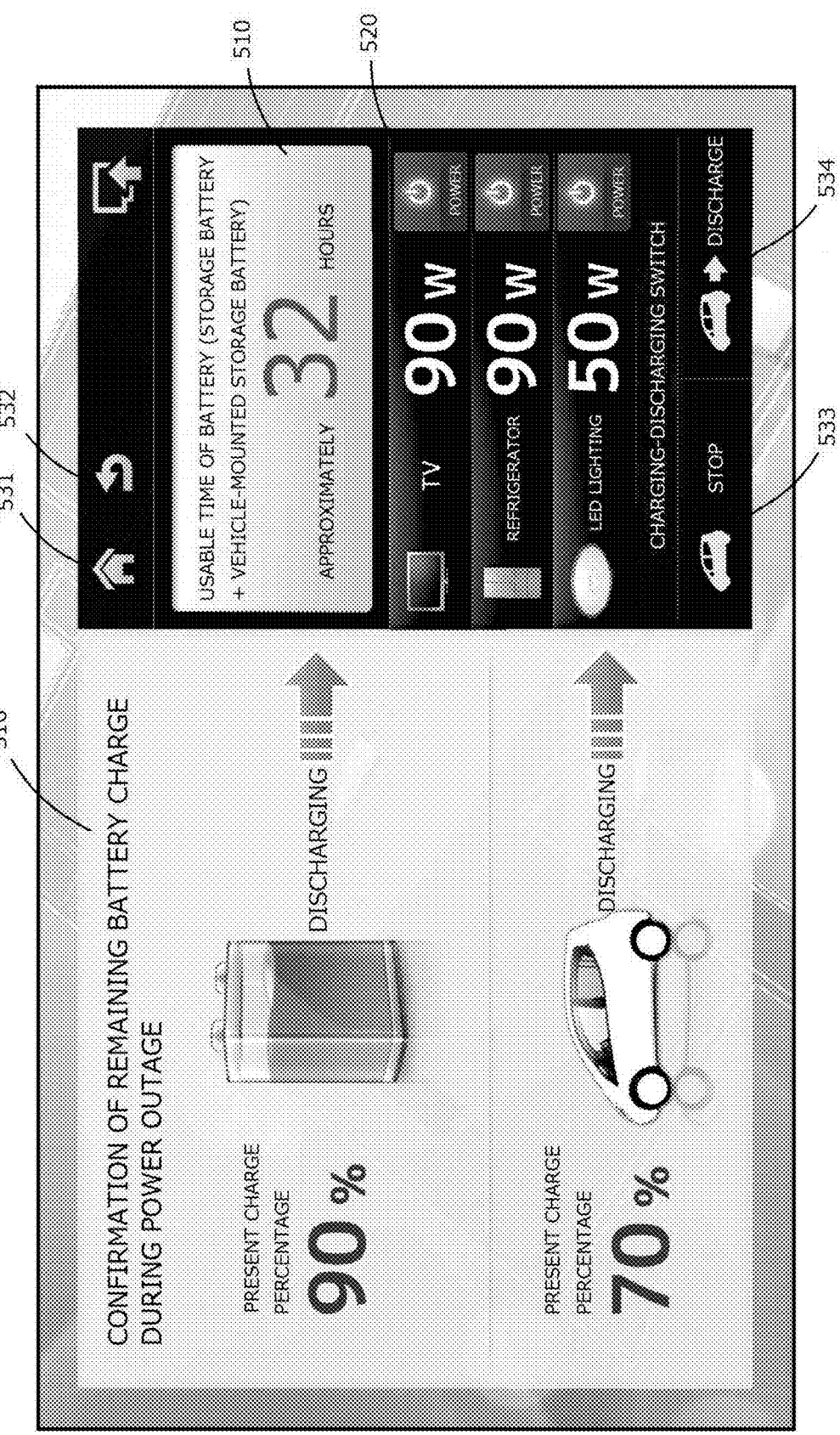
FIG. 9 is an explanatory diagram illustrating the screen in a different state from that in FIG. 8.
Figure 10:
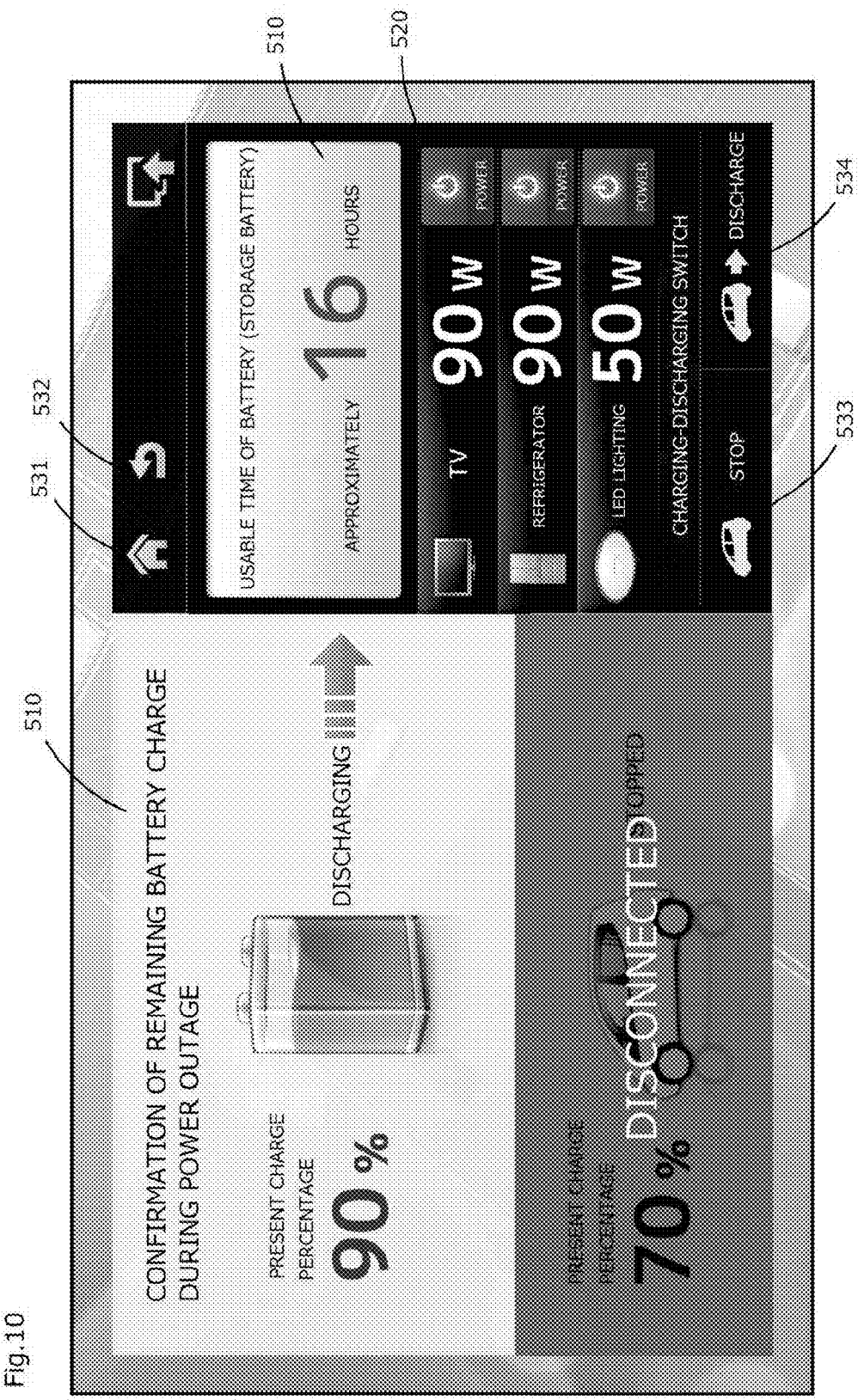
FIG. 10 is an explanatory diagram illustrating the screen in a state that differs again from that in FIG. 9.

FIGS. 8, 9 and 10 are an example of screens that are different from those in FIG. 5, and are explanatory diagrams illustrating an example of screens that take the connection of the vehicle-mounted storage battery 200U into consideration. FIG. 8 is an example of a state in which the vehicle-mounted storage battery 200U is connected to the vehicle-mounted storage battery connecting portion 306 but is not discharging. FIG. 9 is an example of a state in which the vehicle-mounted storage battery 200U is discharging. FIG. 10 is an example of a state in which the vehicle-mounted storage battery is not connected to the vehicle-mounted storage battery connecting portion 306.

The screen illustrated in FIG. 8 is mainly configured from a storage battery information display section 510 of a left side region, and a right side black-framed region. At the top side of the storage battery information display section 510 of the left side, the present remaining battery charge (percentage display) and the charge-discharge state are displayed together with an illustration of the storage battery 200Y. In the example of FIG. 8, the remaining charge is 90% and the storage battery 200Y is discharging. At the bottom side, the present remaining battery charge and the charge-discharge state of the vehicle-mounted storage battery 200U are displayed together with an illustration of an electric automobile. In the example of FIG. 8, the remaining charge is 70% and the charging and discharging are stopped. In other words, in FIG. 8, it is shown that the storage battery 200Y of the power management system 1 is supplying power to the household electrical devices and is performing independent operation. There is no supply of power from the vehicle-mounted storage battery 200U.

Meanwhile, in the right side black-framed region, the "home" button 531 and the "back" button 532 are disposed on the top edge portion. In the window portion therebelow, the storage battery information display section 510 is disposed, and the usable time of the storage battery is displayed. In the example of FIG. 8, the usable time is predicted to be "approximately 16 hours". Further down is the device status display section 520. Three icons, a television, a refrigerator, and a LED lighting, are displayed in this portion as the household electrical devices. These correspond to the television 200B, the refrigerator 200D, and the lighting equipment 200E illustrated in FIG. 1.

The television is operating and consuming 90 W of power, the refrigerator is operating and consuming 90 W of power, and the LED lighting is lit and consuming 50 W of power. In this example, the microwave oven 200C and the air conditioner 200A are not set as targets to which power will be supplied from the storage battery. Therefore, the microwave oven 200C and the air conditioner 200A are not displayed in the storage battery information display section 510. Three household electrical devices are displayed in FIG. 8; however, when power is supplied to three or more household electrical devices from the storage battery, it is possible to display the other household electrical devices using a scroll bar.

Device power buttons 540 are displayed on the right side of the icons of the power devices. It is possible to operate and stop the household electrical devices by touching these buttons. With this premise, the household electrical devices are connected to the network 401 and perform transactions with the indoor power management server 120. In other words, the CPU 121 may control the operations of the household electrical devices in response to touch operations of the device power buttons 540 of the household electrical devices displayed in the device status display section 520. Note that, in the example illustrated in FIGS. 8 to 10, the operations of the devices are stopped by touching the device power buttons 540 of the devices, and display is performed by computing the usable time of the storage battery according to the states of the devices. As a modification example, control buttons that set the operation modes of the devices may be further displayed. A configuration may be adopted in which, when the control button is touched, the menu which sets the corresponding device is displayed on the screen, and the setting of corresponding device can be performed using the menu.

A "stop" button 533 and a "discharge" button 534 which switch between whether or not to perform a supply of power from the vehicle-mounted storage battery 200U during independent operation are further displayed below the icons of the household electrical devices. These two buttons are of the alternative type, and when one of the buttons is touched, the CPU 121 enables the function of the button that is touched in response to the touch operation, and maintains the state. In the example of FIG. 8, "stop" is enabled, and the supply of power from the vehicle-mounted storage battery 200U is not performed during independent operation. The lettering "stopped" displayed on the right side of the illustration of the electric automobile indicates this state.

In this state, when the "discharge" button 534 is touched, the CPU 121 starts the supply of power from the vehicle-mounted storage battery 200U in response to the operation event.

FIG. 9 illustrates an example of a screen, which is the screen illustrated in FIG. 8, and when the "discharge" button 534 is touched, the screen is updated in response to the operation. As illustrated in FIG. 9, the lettering "discharging" is displayed on the right side of the illustration of the electric automobile, and the usable time of the storage battery information display section 510 that is further to the right side is updated from 16 hours to 32 hours. A message "usable time of battery (storage battery +vehicle-mounted storage battery)" is displayed above the updated usable time, and it is indicated that power is being supplied from the storage battery 200Y and the vehicle-mounted storage battery 200U.

FIG. 10 indicates a state in which the connection of the vehicle-mounted storage battery connecting portion 306 is cut, and the charging and discharging from the vehicle-mounted storage battery 200U has stopped. As illustrated in FIG. 10, the illustration portion of the electric automobile is displayed grayed out, the "stopped" state is displayed on the right side, and further, the message "disconnected" is displayed to overlap. The usable time is only the storage battery 200Y, and accordingly, the usable time is displayed as "approximately 16 hours".

<(Second) Flowchart>

FIG. 11 is a flowchart illustrating the processes performed by the CPU 121 in relation to the operation of the device power buttons 540 illustrated in FIG. 8. Description will be given of the process in accordance with FIG. 11.

When the user touches the device power buttons 540 on right side of each of the power devices of FIG. 8, the operation event is transmitted to the indoor power management server 120. When the operation event is received, the CPU 121 of the indoor power management server 120 responds to the operation event (step S51), and performs the next process. In other words, the illustration of the lamp of the display of the device power button 540 of the selected device is caused to light or to go out (step S53). The operation and the stopping of the household electrical device are controlled according to the operation of the device power button 540 (step S55).

<Calculation of Usable Time>

Description will be given of the procedure of the CPU 121 calculating the usable time of the storage battery. The CPU 121 sequentially performs the calculation of the usable time of the storage battery. The calculation may be executed at a fixed interval that is determined in advance; however, even if the interval is not determined, the calculation may be executed repeatedly. In one example, the calculation of the usable time is performed at an interval of approximately five seconds. This is because the meters 400 transmit the power information to the indoor power management server 120 at an interval of approximately five seconds. The CPU 121 calculates the usable time of the storage battery based on the following equation.

Usable time of storage battery (time)=remaining capacity of storage battery (kilowatt hours)/total power consumption of household electrical devices (kilowatts)

The remaining capacity of the storage battery indicated in the above equation is acquired via the network 401 from the storage battery 200Y. When the vehicle-mounted storage battery 200U is connected to the vehicle-mounted storage battery connecting portion 306, the remaining capacity is also acquired from the vehicle-mounted storage battery 200U. When the vehicle-mounted storage battery 200U supplies power to the household electrical devices, the remaining capacities of the storage battery 200Y and the vehicle-mounted storage battery 200U are totaled.

The total of the power consumptions of the household electrical devices may be obtained by totaling the power information acquired from the meters 400. In this case, the power consumptions of the moment that the measuring apparatuses 400 perform the measurement of the household electrical devices are totaled. Therefore, when the operational states of the household electrical devices change, the total of the power consumptions also changes. As a different example, the history of the power consumption of each of the household electrical devices may be stored in the memory 123 or the hard disk 129 of the indoor power management server. The average power of the household electrical devices may be calculated from the histories, and the total of the power consumptions may be obtained using the average power.

Several patterns are conceivable for how to obtain the average power. As the most simple pattern, a method in which the average power of a recent period that is determined in advance may be exemplified. For example, the average power of a period of the most recent hour, day, or month. Examples of other patterns include: the average power of the history of the same year, same month, and same day; the average power of the same month, the same day; the average power of the previous day; the average power from when the usage of the household electrical device started until the present; and the like.

When actually performing the independent operation, the total of the power consumptions of the household electrical devices may be obtained using the current value obtained from the current sensor 305 of the distribution board 300 and the voltage value obtained from the voltage input ADC (not shown) of the indoor power management server. The voltage input ADC is contained in the power detection unit (not shown) of the indoor power management server.

There may be various modification examples in relation to the invention in addition to the aforementioned embodiments. The modification examples should not be interpreted as exceeding the scope of the invention. The invention should include that which equal meaning to the scope of the claims and all modifications within the above-stated scope.

REFERENCE SIGNS LIST

1 POWER MANAGEMENT SYSTEM
100 MANAGEMENT TERMINAL
101 CPU
103 DISPLAY
104 TOUCH PANEL
105 OPERATION BUTTON
106 COMMUNICATION INTERFACE
107 OUTPUT INTERFACE
108 INPUT INTERFACE
110 MEMORY
111 SPEAKER
120 INDOOR POWER MANAGEMENT SERVER
121 CPU
122 CLOCK
123 MEMORY
126 COMMUNICATION INTERFACE
129 HARD DISK
200 HOUSEHOLD ELECTRICAL DEVICES
200A AIR CONDITIONER
200B TELEVISION
200C MICROWAVE OVEN
200D REFRIGERATOR
200E LIGHTING EQUIPMENT
200F WATER HEATER
200U VEHICLE-MOUNTED STORAGE BATTERY
200X PHOTO-VOLTAIC GENERATION DEVICE
200Y STORAGE BATTERY
200Z POWER CONDITIONER
250A, 250B, 250C, 250D, 250E PLUGS
300 DISTRIBUTION BOARD
302 CURRENT SENSOR
304 FLOW AMOUNT SENSOR
305 CURRENT SENSOR
306 VEHICLE-MOUNTED STORAGE BATTERY CONNECTING PORTION
400, 400A, 400B, 400C, 400D, 400E METERS
401 NETWORK
402 POWER LINE
4001 SOCKET
4002 PLUG
4003 SHUNT RESISTOR
4004, 4005 MAIN WIRING
4007 POWER UNIT
4010 POWER DETECTION UNIT
4011 VOLTAGE INPUT ADC
4012 CURRENT INPUT ADC
4013 MULTIPLIER
4014 DIGITAL/FREQUENCY CONVERSION UNIT
4020 COMMUNICATION MODULE
4021 CPU
4022 ROM
4023 RAM
4024 GPIO
4025 WIRELESS RF UNIT
4030 ANTENNA
4041 LED
4042 SETTING BUTTON
410 REPEATER
510 STORAGE BATTERY INFORMATION DISPLAY SECTION
520 DEVICE STATUS DISPLAY SECTION
521 SCROLL BAR
530 STATUS BAR
531 "HOME" BUTTON
532 "BACK" BUTTON
533 "STOP" BUTTON
534 "DISCHARGE" BUTTON
540 DEVICE POWER BUTTON

The invention claimed is:

1. A power information display device, comprising:
power information acquisition circuitry that acquires information relating to a remaining capacity of a storage battery, and information relating to power consumption of devices that use power of the storage battery; and
a display which displays usable time of the storage battery when a plurality of devices are operating, and usable time when at least one of the plurality of devices has stopped; wherein
the display displays on a same screen both the usable time according to the power of the storage battery when the plurality of devices are operating, and the usable time when at least one of the plurality of devices has stopped;
the display selectively displays an operating state and a stopped state of each of the plurality of devices, displays a power information of each of the plurality of devices, and the display displays as the usable time the operating state or the stopped state of the plurality of devices on the same screen; and
the display is operated by a user to perform a simulation of the usable time by causing each of the plurality of devices to operate and stop individually.

2. A power information display system, comprising:
a storage battery;
a power meter which measures information relating to power consumption of devices that use power of the storage battery; and
the power information display device, including:
power information acquisition circuitry that acquires information relating to a remaining capacity of a storage battery, and information relating, to power consumption of devices that use power of the storage battery; and
display which displays usable time of the storage battery when a plurality of devices are operating, and usable time when at least one of the plurality of device has stopped; wherein
the display displays on a same screen both the tine according to the power of the storage battery when the plurality of devices are operating, and the usable time when at least one of the plurality of devices has stopped;
the display selectively displays an operating state and a stopped state of each of the plurality of devices, displays a power information of each of the plurality of devices, and the display displays as the usable time the operating state or the stopped state of the plurality of devices on the same screen; and the display is operated by a user to perform a simulation of the usable time by causing each of the plurality of devices to operate and stop individually.

3. A power information display method, comprising:

acquiring information relating to a remaining capacity of a storage battery, and information relating to power consumption of devices that use power of the storage battery;

calculating usable time of the storage battery when a plurality of devices are operating, and usable time when at least one of the plurality of devices has stopped;

displaying the calculated usable times on a display;

the displaying step displays the usable time according to the power of storage battery when the plurality of devices are operating, and the usable time when at least one of the plurality of devices has stopped;

the display selectively an operating state and a stopped state of each of the devices, displays a power information of each of the devices, and displays the operating state or stopped state of the devices on the same screen; and the method further comprising a step of operating the display to perform a simulation of the usable time by causing each of the plurality of devices to operate and stop individually.

4. The power information display device of claim 1, wherein
the simulation of the usable time corresponds to a usable time of the storage battery when at least one of the plurality of devices has been stopped.

5. The power information display device of claim 1, wherein
when a displayed one of each of the plurality of devices is selected using the display, in addition to switching ON or OFF of the simulation of the usable time, operation of each of the plurality of devices is controllable so that a user is able to select whether each of the plurality of devices is operating, or the simulation is ON or OFF.

6. The power information display device of claim 1, further comprising:
information provision circuitry which notifies a user when an anticipated usable time of one of the plurality of devices that has been calculated differs from a present usable time of the one of the plurality of devices.

7. The power information display device of claim 1, further comprising:
photo-voltaic generation circuitry; wherein
the usable time is calculated by selectively including a power generation of the photo-voltaic generation circuitry, or excluding the power generation of the photo-voltaic generation circuitry.

8. The power information display device of claim 1, further comprising:
a vehicle-mounted storage battery; wherein
the usable time is calculated by selectively including power information of the vehicle-mounted storage battery, or excluding the power information of the vehicle-mounted storage battery.

* * * * *